(12) United States Patent
Ninomiya et al.

(10) Patent No.: US 7,977,221 B2
(45) Date of Patent: Jul. 12, 2011

(54) METHOD FOR PRODUCING STRAINED SI-SOI SUBSTRATE AND STRAINED SI-SOI SUBSTRATE PRODUCED BY THE SAME

(75) Inventors: Masaharu Ninomiya, Tokyo (JP); Koji Matsumoto, Tokyo (JP); Masahiko Nakamae, Tokyo (JP); Masanobu Miyao, Fukuoka (JP)

(73) Assignees: Sumco Corporation (JP); Kyushu University, National University Corporation (JP)

( * ) Notice: Subject to any disclaimer, the term of this patent is extended or adjusted under 35 U.S.C. 154(b) by 879 days.

(21) Appl. No.: 11/868,296

(22) Filed: Oct. 5, 2007

(65) Prior Publication Data
US 2009/0090933 A1     Apr. 9, 2009

(51) Int. Cl.
*H01L 21/20* (2006.01)
*H01L 21/36* (2006.01)

(52) U.S. Cl. . 438/509; 438/530; 438/795; 257/E21.103; 257/E21.12

(58) Field of Classification Search .......... 438/481, 438/502, 509, 530, 795–797, 458; 257/E21.103, 257/E21.12
See application file for complete search history.

(56) References Cited

U.S. PATENT DOCUMENTS

| 5,461,243 | A | 10/1995 | Ek et al. |
| 5,906,951 | A | 5/1999 | Chu et al. |
| 6,369,438 | B1 | 4/2002 | Sugiyama et al. |
| 7,084,051 | B2 * | 8/2006 | Ueda .............. 438/518 |
| 2005/0208780 | A1 * | 9/2005 | Bedell et al. .......... 438/796 |
| 2006/0019476 | A1 * | 1/2006 | Lagahe et al. ........ 438/514 |
| 2006/0214257 | A1 * | 9/2006 | Ninomiya et al. ....... 257/502 |

FOREIGN PATENT DOCUMENTS

| EP | 1705698 A2 * | 9/2006 |
| JP | H07-169926 A | 7/1995 |
| JP | H09-321307 A | 12/1997 |
| JP | H10-308503 | 11/1998 |
| JP | 2000-243946 A | 9/2000 |
| JP | 2003-128494 | 5/2003 |
| JP | 2004-040122 | 2/2004 |

(Continued)

OTHER PUBLICATIONS

Extended Abstracts of the 2002 International Conference on Solid State Devices and Materials, pp. 8 to 11 (ISSDM2002, Nagoya, 2002).

(Continued)

*Primary Examiner* — Matthew C Landau
*Assistant Examiner* — Joseph C Nicely
(74) *Attorney, Agent, or Firm* — Kolisch Hartwell, P.C.

(57) ABSTRACT

A strained Si—SOI substrate, and a method for producing the same are provided, wherein the method includes the steps of growing a SiGe mixed crystal layer 14 on an SOI substrate 10 having an Si layer 13 and a buried oxide film 12; forming protective films 15, 16 on the surface of the SiGe mixed crystal layer 14; implanting light element ions into a vicinity of the interface between the Si layer 13 and the buried oxide film 12; performing a first heat treatment at a temperature in the range of 400 to 1000° C.; performing a second heat treatment at a temperature not lower than 1050° C. under an oxidizing atmosphere; performing a third heat treatment at a temperature not lower than 1050° C. under an inert atmosphere; removing the Si oxide film 18 formed on the surface; and forming a strained Si layer 19.

9 Claims, 8 Drawing Sheets

FOREIGN PATENT DOCUMENTS

| | | |
|---|---|---|
| JP | 2004-342819 | 12/2004 |
| JP | 2004-363197 | 12/2004 |
| JP | 2004-363198 A | 12/2004 |
| JP | 2004-363592 | 12/2004 |
| JP | 2005050984 A * | 2/2005 |
| JP | 2005-236272 | 9/2005 |
| JP | 2006-506821 | 2/2006 |
| JP | 2006-237235 | 9/2006 |
| JP | 2006269999 A * | 10/2006 |
| WO | 2004/047150 | 6/2004 |

OTHER PUBLICATIONS

Office action issued Oct. 19, 2010 in connection with related Japanese Application No. 2005-090083.

* cited by examiner

FIG. 1α

Rms: 0.60nm

Rms: 0.42nm

5 μm

METHOD FOR PRODUCING STRAINED SI-SOI SUBSTRATE AND STRAINED SI-SOI SUBSTRATE PRODUCED BY THE SAME

BACKGROUND OF THE INVENTION

1. Field of the Invention

The present invention relates to a method for producing a strained Si—SOI (Silicon-On-Insulator) substrate for a performance semiconductor device, and a strained Si—SOI substrate produced by the same. Specifically, the present invention relates to a technology suitable for use in a strained Si—SOI substrate, which improves the quality of an SOI wafer having a relaxed SiGe layer and a strained Si layer on an oxide film, that is, reducing the roughness, and decreasing the defects.

2. Description of Related Art

High speed current and low power consumption in silicon MOS devices have been realized compatibly, depending on the scaling law, either by minimizing the size of a device or by decreasing the operation voltage.

However, it is difficult to retain such compatible effects within a micro device having a gate length of less than 100 nm.

Accordingly, introduction of SOI substrates and strained silicon have been reviewed recently. Particularly, various investigations have been carried out on the production of SOI substrates having strained silicon introduced thereon as the most desirable substrate according to current technology.

As a first method, there is provided a combination of an SOI substrate and a SiGe by epitaxial technique.

For example, Patent Reference 1 describes a method in which a relaxed SiGe layer is formed by epitaxial growth of SiGe on an SOI substrate, and a layer of a strained Si is formed by the epitaxial grown of an Si layer on the relaxed SiGe.

As a second method, Patent Reference 2 describes a method for forming a strain relaxed SiGe layer on a buried oxide film using an SIMOX (Separation by Implanted Oxygen) method.

As a third method, Patent Reference 3 describes a method for relaxation of strain by forming a SiGe film on an SOI substrate, subsequently heat-treating the substrate under oxidizing atmosphere, and thereby causing downward diffusion of Ge, thinning of the SiGe layer, and Ge enrichment in the layer.

As a fourth method, Patent Reference 4 describes a method for strain relaxation of a SiGe film by forming a SiGe layer on an SOI substrate, melting the SiGe layer by heat treatment, and subsequently solidifying the SiGe layer while diffusing Ge in the layer.

As a fifth method, Patent Reference 5 describes a method for forming a Si—SOI substrate.

As a sixth method, a method for forming a strained silicon-SOI substrate in which only strained silicon exists in a buried oxide film utilizing a bonding method is described in Non-Patent Reference 1.

Patent Reference 1: Japanese Unexamined Patent Application, First Publication No. Hei 07-169926
Patent Reference 2: Japanese Unexamined Patent Application, First Publication No. Hei 09-321307
Patent Reference 3: Japanese Unexamined Patent Application, First Publication No. 2000-243946
Patent Reference 4: Japanese Unexamined Patent Application, First Publication No. 2000-243946
Patent Reference 5: Japanese Unexamined Patent Application No. Hei 10-116473
Patent Reference 6: Japanese Unexamined Patent Application, First Publication No. 2004-363198
Non-Patent Reference 1: Extended Abstracts of the 2002 International Conference on Solid State Devices and Materials, pages 9 to 10 (ISSDM2002, Nagoya, 2002)

However, each of the above-described first to fifth methods are directed to a method for forming a relaxed SiGe layer on an insulating layer which is formed on a Si substrate, and forming strained Si on the SiGe layer. For example, in the case of using a buffer layer in which the Ge content is increased with a moderate gradient, generation of dislocations causes surface irregularities on the SiGe surface. Such surface irregularities reflect the distribution of dislocation lines and include lattice like steps called cross-hatches. Since the surface irregularities have an adverse effect on the photolithography which is carried out during a device-production process, it is necessary to remove the irregularities. Conventionally, a similar step for polishing the Si has been applied to the step for polishing the SiGe. However, in this case, the penetrating dislocation densities and the surface roughness of the formed SiGe layer have been insufficient, as compared with the desirable level for a device or a desirable level for raw materials for device production. Especially, the above-described cross-hatches are not uniformly distributed across the entire surface. At intervals of about several μm, the cross-hatches generate relatively large steps of about several tens of nm in height. It has been difficult to polish off such surface irregularities of the cross-hatches during polishing the SiGe using a general method for polishing the Si.

On the other hand, in the sixth method, only strained Si is formed on an insulating layer which has been formed on a Si substrate. However, the bonding method for making the strained Si—SOI substrate requires the epitaxial growth of a thick strained Si/SiGe layer and a plurality of steps including a bonding step, an exfoliation step, a film thinning step, and the like. Therefore, such a method has a disadvantage in that production cost is high.

In order to overcome such a problem, in Patent Reference 6, the Applicant disclosed a method for producing a semiconductor substrate having a Si substrate and a SiGe layer epitaxially grown on the Si substrate. The method comprises a film formation step of epitaxially growing a SiGe layer on a Si substrate; an oxide film formation step subsequent to the film formation step of the SiGe layer by oxidizing an upper surface of the SiGe layer; and an oxide film removal step subsequent to the oxide film formation step for removing the oxide film by etching (see, for example, Patent Reference 6). In this method as described in Patent Reference 6, after forming sequentially an amorphous SiGe layer having a predetermined Ge content and an amorphous silicon thin foil on an SOI substrate, hydrogen ions are implanted in the interface between the BOX (buried oxide) layer and the Si layer in the SOI substrate. The substrate is subject to heat treatment at least once at a predetermined temperature for a predetermined time under an oxidizing atmosphere. Subsequently, the substrate is subject to a heat treatment for melting the amorphous SiGe layer and the amorphous silicon layer. After the removal of the oxide film, strained silicon is formed.

However, in the above-described method, there is still a demand for further alleviation of the roughness of a new substrate surface, and the defects on the surface.

In accordance with the above-described circumstances, the present invention has been made. In this regard, it is an object of the present invention to provide a method for producing strained Si—SOI substrate having a flat surface and reduced defects. It is another object of the present invention to provide a strained Si—SOI substrate produced by the method.

SUMMARY OF THE INVENTION

The present inventors have made extensive studies on a strain relaxation process of a SiGe layer formed on an SOI substrate, and as a result, they found a method that can provide a strain relaxed SiGe layer and a strained Si layer, both having reduced defects and a flat surface, on a silicon oxide film of an SOI substrate.

The method for producing a strained Si—SOI substrate according to the present invention includes the steps of growing a SiGe mixed crystal layer on an SOI substrate having a Si layer of not less than 5 nm in thickness and a buried oxide film; forming a protective film on the surface of the SiGe mixed crystal layer; implanting light element ions into a vicinity of the interface between the silicon layer and the buried oxide film; performing a first heat treatment for heat treating the substrate at a temperature in the range of 400 to 1000° C.; performing a second heat treatment for heat treating the substrate at a temperature not lower than 1050° C. under an oxidizing atmosphere: performing a third heat treatment for heat treating the substrate at a temperature not lower than 1050° C. under an inert atmosphere; removing the Si oxide film formed on the surface; and forming a strained Si layer.

The SiGe mixed crystal layer is preferably an epitaxial layer.

The protective film may be a Si layer, a vapor growth $SiO_2$ film, or a multi-layered film of a Si layer and a vapor growth $SiO_2$ film.

The light element may be selected from a group consisting of hydrogen, helium, fluorine, and neon.

The first heat treatment may be performed under an inert atmosphere.

The first heat treatment may include a low temperature treatment at a temperature in the range of 400 to 650° C., and a high temperature treatment at a temperature in the range of 650 to 1000° C.

The strained Si layer may be formed by epitaxial growth.

The strained Si—SOI substrate according to the present invention is produced by the above-described methods.

The method for producing a strained Si—SOI substrate according to the present invention includes the steps of growing a SiGe mixed crystal layer on an SOI substrate having a Si layer of not less than 5 nm in thickness and a buried oxide film; forming a protective film on the surface of the SiGe mixed crystal layer; implanting light element ions into a vicinity of the interface between the silicon layer and the buried oxide film; performing a first heat treatment for heat treating the substrate at a temperature in the range of 400 to 1000° C.; performing a second heat treatment for heat treating the substrate at a temperature not lower than 1050° C. under an oxidizing atmosphere; performing a third heat treatment for heat treating the substrate at a temperature not lower than 1050° C. under an inert atmosphere; removing the Si oxide film formed on the surface; and forming a strained Si layer. As a result, light elements implanted by the ion implantation during the first heat treatment after the formation of the SiGe mixed crystal layer weaken the bonding strength between the single crystalline Si layer and the buried insulating layer. By the second heat treatment Ge diffusion from the SiGe layer to the Si layer changes the Si layer into a SiGe layer. At the same time, oxidization of Si in the SiGe layer forms a Si oxide layer on the surface of the SiGe layer. Thus, the Ge concentration is increased in the SiGe layer as the film thickness of the SiGe layer is decreased. By the third heat treatment, light elements implanted by the ion implantation in the substrate weaken the bonding strength between the SiGe layer and the buried insulating layer. After removing the oxide film on the surface, a strained Si layer is formed on the surface of the substrate.

Since the above-described method decreases the bonding strength between the single crystalline Si layer and the buried insulating layer, relaxation of strain easily occurs in the SiGe mixed crystal layer, and it is possible to obtain a relaxed SiGe layer and a strained Si layer, both having reduced defects and a flat surface.

When the SiGe mixed crystal layer is an epitaxial layer, it is possible to flatten the interface between the SiGe mixed crystal layer and the strained Si layer 13 with reduced defects.

When the protective film of the present invention is a Si layer, a vapor growth $SiO_2$ film, or a multi-layered film of a Si layer and a vapor growth $SiO_2$ film, that is, when a Si layer, or a compound layer comprising a Si layer and a $SiO_2$ layer is used, it is possible to prevent evaporation loss of Ge from the surface of the SiGe mixed crystal layer during the heat treatment. At the same time, the roughness of the surface of the SiGe mixed layer can be controlled.

When the light element is selected from the group consisting of hydrogen, helium, fluorine, and neon, such elements implanted by ion implantation are caused to weaken the bonding strength between the single crystalline Si layer and the buried insulating layer, and enhance the strain relaxation of the SiGe mixed crystal layer during the subsequent heat treatment. Therefore, it is possible to obtain a SiGe layer and a strained Si layer formed on the SiGe layer, both having reduced defects and a flat surface.

In the case of implanting fluorine, neon, or helium ions, the amount of ions to be implanted may be determined in inverse proportion to the atomic weight of the element per atomic weight of hydrogen. For example, the amount of helium to be implanted may be one fourth of the amount of hydrogen to be implanted.

When the first heat treatment is performed under an inert atmosphere, the light elements are concentrated at the interface between the single crystalline Si layer and the buried oxide film, and thus weaken the bonding strength between the single crystalline Si layer and the buried oxide film.

When the first heat treatment comprises a low temperature heat treatment at a temperature in the range of 400 to 650° C. and a high temperature heat treatment at a temperature in the range of 650 to 1000° C. hydrogen, helium, fluorine, or neon implanted in the vicinity of the interface between the single crystalline Si layer and the buried oxide film is caused to concentrate at the interface during the first heat treatment, and thus weaken the bonding strength between the single crystalline Si layer and the buried oxide film. By performing such two-stage heat treatments during the first heat treatment, it is possible to weaken the bonding strength between the single crystalline Si layer and the buried oxide film. The subsequent third heat treatment enhances the strain relaxation of the SiGe layer, thereby enhancing defect reduction and flatness of the surfaces of the SiGe layer. Accordingly, a strained Si layer is easily obtained.

Further, when the strained Si layer is formed by the epitaxial growth, the interface between the SiGe layer and the strained Si layer can be flattened, and thus defects can be reduced.

Since the strained Si—SOI substrate according to the present invention is produced by the above-described methods, the strained Si layer of the strained Si—SOI has flat surface and reduced surface defects of the strained Si layer.

A representative embodiment of the method for producing a strained Si—SOI substrate according to the present invention includes the following steps of: forming a SiGe layer (a SiGe mixed crystal layer), and a protective film including at least a layer (protective film) selected from a Si layer and a $SiO_2$ film on a single crystalline Si layer of an SOI substrate;

subsequently, implanting light element ions such as hydrogen, helium, fluorine, neon ions, or other ions into the vicinity of the interface between the single crystalline silicon layer and a buried oxide film; performing heat treatment (a first heat treatment) at a temperature in the range of 400 to 1000° C. to cause the implanted ions to concentrate at the interface between the single crystalline Si layer and the buried oxide film; performing a heat treatment (a second heat treatment) at a temperature not lower than 1050° C. under an oxidizing atmosphere to diffuse Ge from a SiGe layer into the single crystalline Si layer and to change the Si layer into an additional SiGe layer, wherein the thickness of the SiGe layer gradually with formation of an oxide film formed on the surface is reduced, and at the same time, the SiGe layer is relaxed; performing a heat treatment (a third heat treatment) at a temperature not lower than 1050° C. to enhance interfacial slip at the interface between the SiGe layer and the buried oxide film; removing the oxide film on the surface, and then forming a strained Si layer by epitaxially growing a Si layer on the layer without the oxide film.

Further, the heat treatment temperatures are controlled to be lower than the solidus temperature depending on the Ge content of the solidified SiGe layer.

The main points regarding the present invention are as follows.

1. The heat treatment temperatures are controlled to be lower than the solidus temperature of the SiGe layer.

2. Hydrogen, helium, fluorine, or neon ions implanted in the vicinity of the interface between a single crystalline Si layer and a buried oxide film of an SOI substrate concentrate at the interface during a first heat treatment at a temperature in the range of 400 to 1000° C. and weaken the bonding strength between the single crystalline Si layer and the buried oxide film. Next a second heat treatment at a temperature not lower than 1050° C. under an oxidizing atmosphere is performed to enhance the strain relaxation of the SiGe layer.

3. A third heat treatment at a temperature not lower than 1050° C. is performed to enhance the interfacial slip at the interface between the SiGe layer and the buried oxide film, thereby enhancing the lattice relaxation of the SiGe layer. Further, a strained Si layer is formed by epitaxially growing a Si layer on the surface for production of a strained Si—SOI substrate.

4. An oxide film formed on the surface is removed, and a strained Si layer is formed by epitaxial growth of a Si layer.

According to the present, invention, the method for producing a strained Si—SOI substrate includes the steps of growing a SiGe mixed crystal layer on an SOI substrate having a Si layer of not less than 5 nm and not more than 100 nm in thickness and a buried oxide film; forming a protective film on the surface of the SiGe mixed crystal layer; Implanting light element ions into a vicinity of the interface between the silicon layer and the buried oxide film; performing a first heat treatment for heat treating the substrate at a temperature in the range of 400 to 1000° C.; performing a second heat treatment for heat treating the substrate at a temperature not lower than 1050° C. under oxidizing atmosphere; performing a third heat treatment for heat treating the substrate at a temperature not lower than 1050° C. under an inert atmosphere; and forming a strained Si layer on the surface. By the heat treatment, Ge is caused to diffuse into the Si layer from the SiGe mixed crystal layer, thereby changing the Si layer into a SiGe mixed layer. At the same time, the light element implanted by ion implantation weakens the bonding strength between the single crystalline Si layer and the buried insulating layer, thereby enhancing the strain relaxation of the SiGe mixed crystal layer during the subsequent heat treatment. Accordingly, it is possible to obtain a relaxed SiGe layer and a strained Si layer, both having reduced defects and flat surface.

DETAILED DESCRIPTION OF THE INVENTION

Figure 1A:
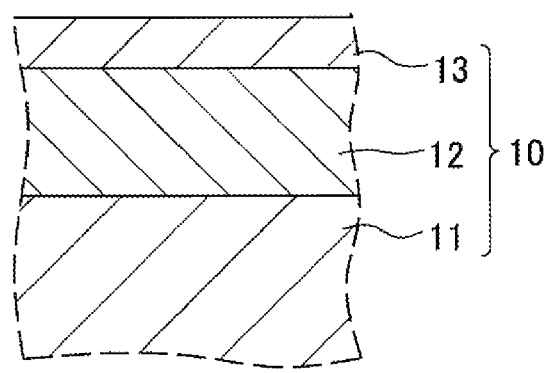
FIGS. 1A to 1F are cross-sectional views indicating steps for an embodiment of a method for producing a strained silicon-SOI substrate according to the present invention.

Hereinbelow, a first embodiment of the method for producing a strained Si—SOI substrate according to the present invention will be described with reference to the drawings.

FIG. 1 is a cross-sectional view of a substrates showing the steps for the method for producing a strained Si—SOI substrate in the present embodiment. FIG. 2 is a process chart showing the method for producing a strained Si—SOI substrate in the present embodiment. In the drawings, the SOI substrate is indicated by the numeral 10.

Next, embodiments according to the present invention will be described with reference to the drawings.

The strained Si—SOI substrate of the present invention is produced by the following method.

Figure 2:
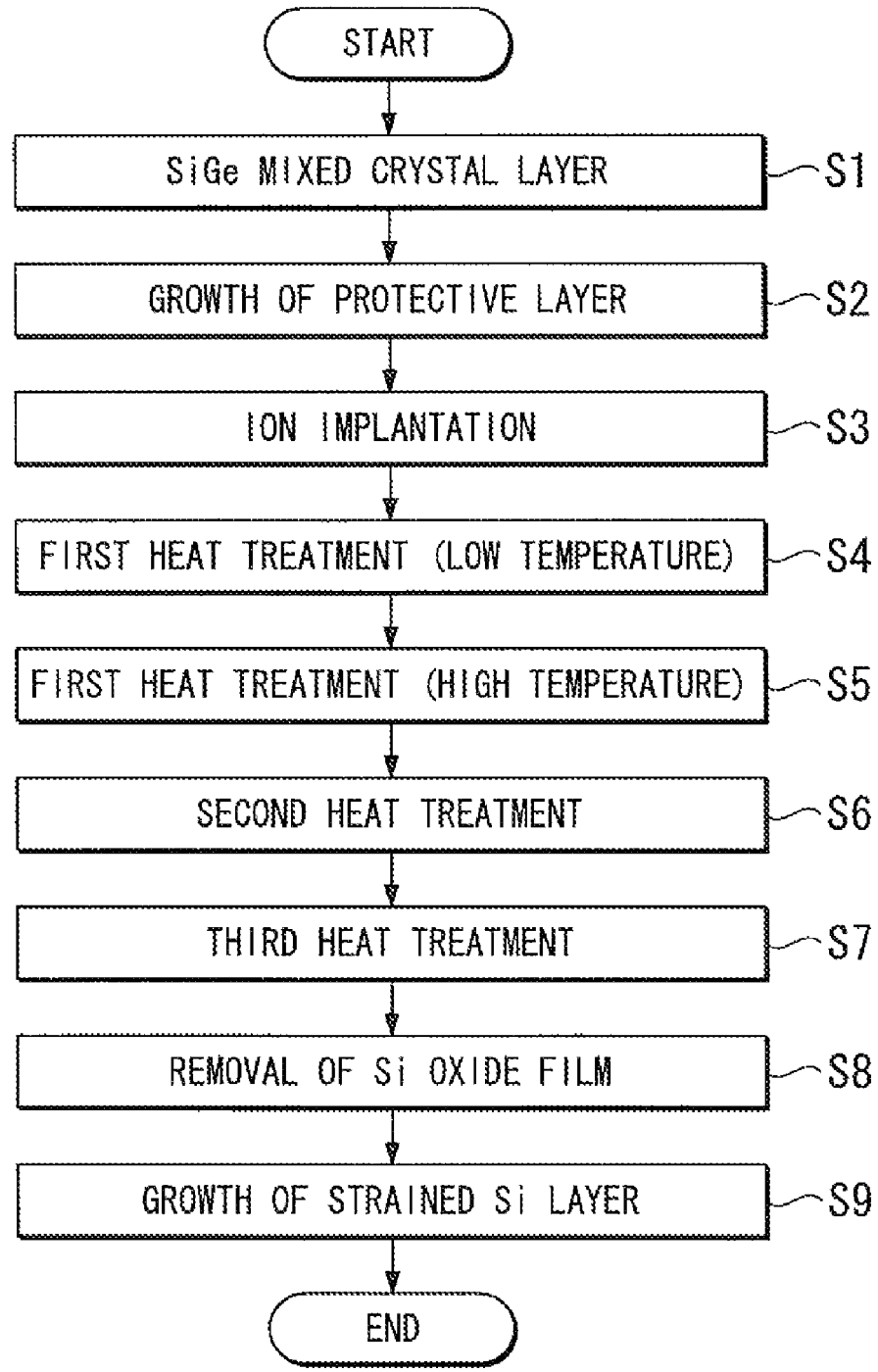
FIG. 2 is a process chart of an embodiment of a method for producing a strained Si—SOI substrate according to the present invention.

Firstly, an SOI substrate 10 comprising an insulating layer (buried oxide film) 12 on a Si substrate 11, and a single crystalline Si layer (Si layer) 13 on the insulating layer 12 is prepared, as shown in FIG. 1A. The SOI substrate 10 may be a bonded SOI wafer produced by bonding a support wafer and an active wafer which is processed into a thin film, or an SOI substrate produced by the SIMOX (Separation by Implanted Oxygen) method. In the SIMOX method, by oxygen implantation from a surface of a wafer, a buried oxide film (a BOX layer) is formed in a portion having a predetermined depth from the wafer surface. The active layer of the bonded SOI substrate may be processed into a thin film by mechanical processing, chemical etching, or vapor phase etching. The bonded SOI substrate may also be formed by a Smart-Gutting method in which hydrogen ions are implanted at a predetermined depth in the active wafer, and using the implanted layer as a starting point, the wafer is cut parallel to the wafer surface, or by an ELTRAN method in which a porous polycrystalline Si layer is formed in a substrate before bonding the two substrates, and the bonded substrate is cut at the polycrystalline Si layer.

The thickness of the Si layer 13 of the SOI substrate 10 is not less than 5 nm. In an SOI substrate formed by the SIMOX method, the thickness of the Si layer is controlled to be in the range of 5 to 100 nm. In an SOI substrate formed by the bonding method, the thickness of the Si layer is 5 to 500 nm or more. As an example of the insulating layer 12, a SiO$_2$ film may be formed.

Figure 1B:
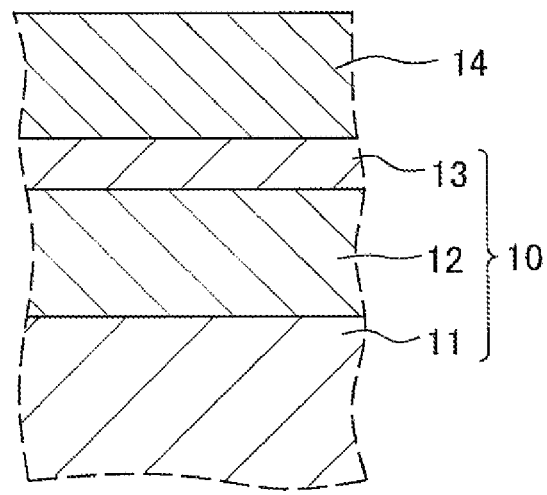

Next, as a step SI in FIG. 2, as shown in FIG. 1B, a SiGe mixed crystal layer (a SiGe layer) 14 is formed on the Si layer 12 of the SOI substrate 10. The SiGe mixed crystal 14 is formed using an apparatus for molecular beam epitaxy (hereinafter referred to as MBE). In this case, after setting the SOI substrate 10 in the MBE apparatus, silicon and germanium are supplied to the apparatus, and the SiGe mixed crystal layer is formed as an epitaxial layer on the Si layer 12. Alternatively, the SiGe mixed layer may also be formed by a chemical vapor deposition (CVD) method, instead of the MBE method.

Figure 1C:
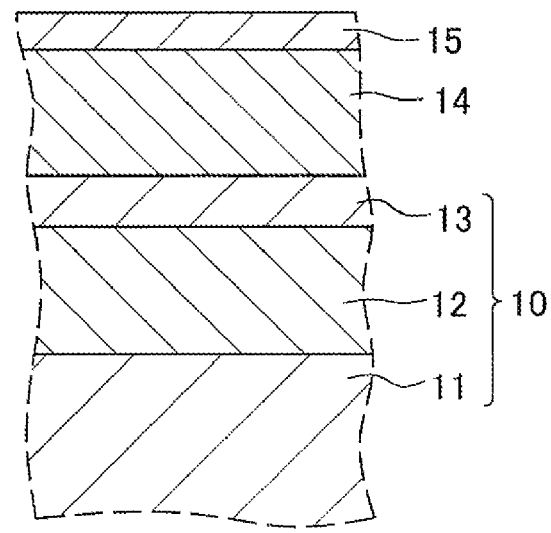
Figure 1D:
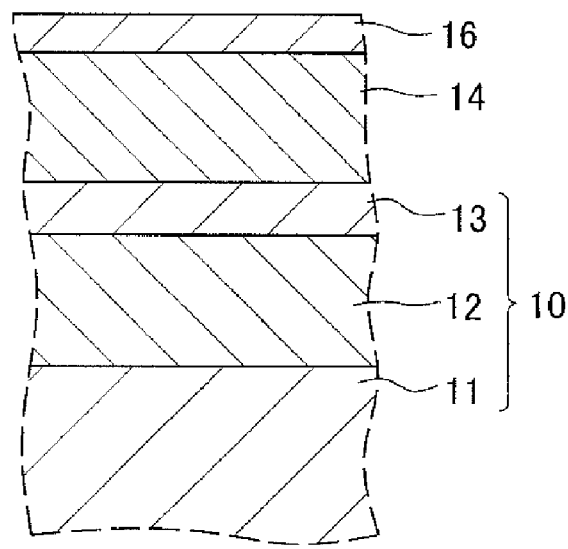
Figure 1D:
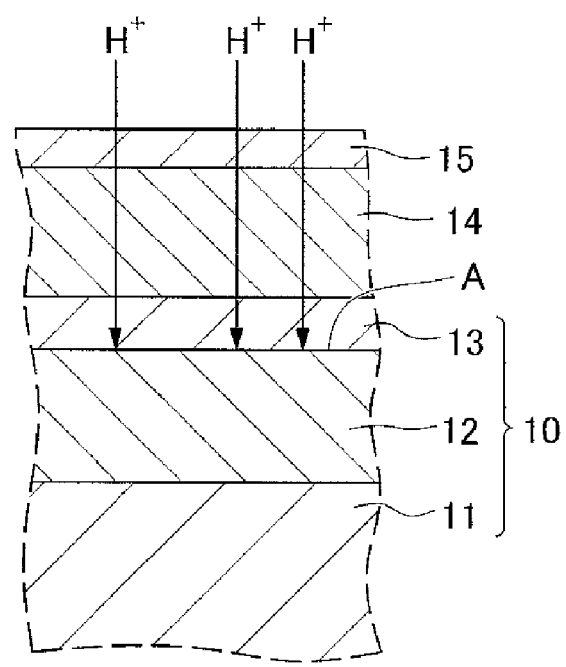

Next, as a step S2 in FIG. 2, as shown in FIGS. 1C and 1D, a protective film is formed on the SiGe mixed crystal layer 14. The protective film is formed to inhibit evaporation of Ge from the surface of the substrate during the subsequent heat treatment.

Figure 3:
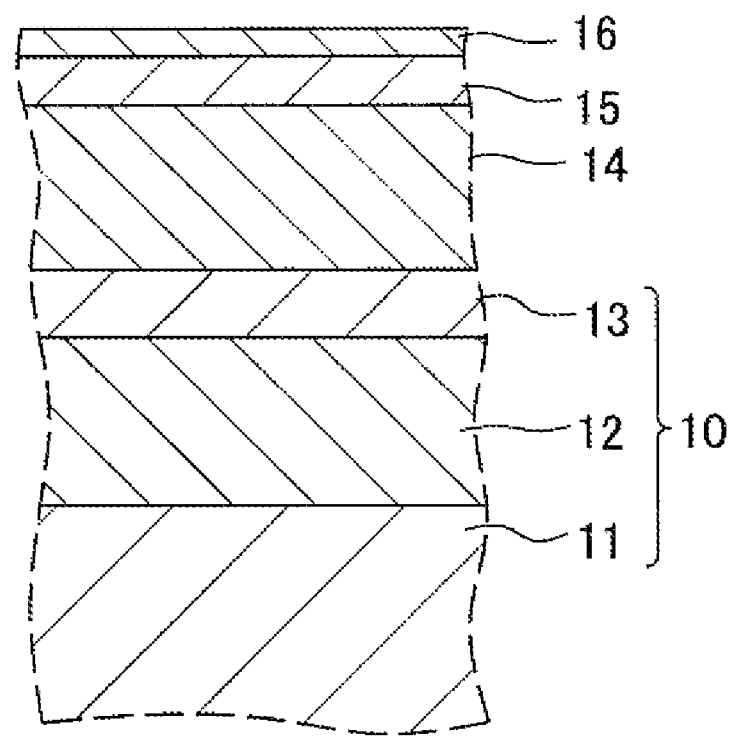
FIG. 3 is a cross-sectional view indicating the steps for an embodiment of the method for producing a strained Si—SOI substrate according to the present, invention.

This protective film may be formed as a Si layer 15 as shown in FIG. 1C, a $SiO_2$ film 16 as shown in FIG. 1D, or as Si layer 15 as shown in FIG. 3, as a composite film comprising a Si layer 15 and a $SiO_2$ film 16 which is formed on the Si layer 15.

In the case of using a Si layer 15 as the protective film as shown in FIG. 1C, during the below-described heat treatment under an oxidizing atmosphere, an oxide film ($SiO_2$ film) 16 is formed, thereby effectively preventing the evaporation of the Ge and reducing the surface roughness of the SiGe mixed crystal layer. The Si layer 15 may also be used to control a Ge concentration of the SiGe mixed crystal layer after the heat treatment.

If the protective film is formed as a $SiO_2$ film 16 shown in FIG. 1D, or a composite layer of a Si layer 15 and a $SiO_2$ film 16 as shown in FIG. 3, evaporation of Ge is prevented during the below-described heat treatment under an inert gas atmosphere. A protective film of the Si layer 15, $SiO_2$ film 16, or a composite layer of these layers may be formed on the SiGe layer 14 by a vapor phase growth method. Examples of the vapor phase growth method include an MBE method, an UHV-CVD (Ultra High Vacuum Chemical Vapor Deposition) method, and a CVD method. When the protective film is formed by the MBE method, after forming the SiGe mixed crystal layer 14, the supply of germane gas (gaseous germanium hydride) is stopped, and the Si layer 15 is formed. The $SiO_2$ film 16, or the composite film may be formed, for example, by forming the Si layer 15 by stopping the supply of germane gas, extracting the substrate from the MBE apparatus, transferring it into an electric furnace, and then heating it at a temperature of not more than 900° C. under oxidizing atmosphere to oxidize all or a part of the Si layer 15.

Next, as a step S3 in FIG. 2, ions of a light element such as hydrogen or helium are implanted so that the interface A between the insulating layer 12 and the Si layer 13, or the vicinity of the interface A show a highest concentration of the light element ions (FIG. 1α).

Here, the interface A is controlled to have the highest ion concentration in the thickness direction of a substrate, since the ion implantation is performed in order to enhance relaxation of the insulating layer 12 and the below-described SiGe mixed crystal layer 17, and for such relaxation, the interface A between the insulating layer 12 and a SiGe layer 17 is required to show a relaxation. Alternatively, a portion of the insulating layer 12 or the Si layer 13 in the vicinity of the interface A may have the highest ion concentration, since the ions may be concentrated at the interface A during the subsequent first heat treatment step.

Further, the interface A and a vicinity thereof may be controlled to be 0 to 30 nm in distance from the interface A in the thickness direction of the substrate.

In a case of implanting hydrogen ions ($H^+$), the amount of ions to be implanted may be preferably controlled to be $1 \times 10^{14}$ to $5 \times 10^{16}$ atoms/cm$^2$. More preferably, the amount of hydrogen ions may be controlled to be $1 \times 10^{15}$ to $1 \times 10^{16}$ atoms/cm$^2$. When the amount of ion to be implanted is less than the lower limit, tire degree of relaxation of the SiGe layer indicated as a peak shift of the Raman spectrum in Raman Spectroscopy does not show a sufficient value. Therefore, it is preferable to control the hydrogen ion amount to be not less than the lower limit. On the other hand, high ion amounts generate bubbles of about several urn in size and $1 \times 10^{14}$/cm$^2$ in density, and thereby disarrange the crystallinity of the SOI substrate 10. Therefore, the amount of hydrogen ions is preferably not more than the upper limit. Instead of implanting hydrogen, or along with implanting hydrogen, helium ions ($He^+$) may be implanted. In tills case, the amount of helium ions is preferably $2.5 \times 10^{13}$ to $1.25 \times 10^{16}$ atoms/cm$^2$. More preferably, the amount of helium ions may be controlled to be $2.5 \times 10^{14}$ to $5 \times 10^{15}$ atoms/cm$^2$. It is also possible to implant fluorine or neon.

A portion to be implanted with ions, including a portion of highest ion concentration is formed parallel to the interface A of the insulating layer 12 and the Si layer 13.

After the ion implantation, as a first heat treatment step as the steps, S4 and S5 in FIG. 2, the substrate is subject to a low temperature heat treatment at a temperature in the range of 400 to 650° C. under an inert gas atmosphere, and a high temperature treatment at a temperature in the range of 650 to 1000° C. under an inert gas atmosphere.

By this first heat treatment, without oxidizing the SiGe layer 14, hydrogen, helium, fluorine, or neon implanted into the vicinity of the interface A of the single crystalline Si layer 13 and the buried oxide film 12 of the SOI substrate 10 are caused to concentrate at the interface A, and weaken the bonding strength of the single crystalline Si layer 13 and the buried oxide film 12. By performing the two-stage heat treatment during the first heat treatment step, the bonding strength between the single crystalline silicon layer and the buried oxide film can be effectively weakened.

Examples of the inert gas atmosphere for heat treatment according to the present invention may be a nitrogen gas, an Ar gas, or a helium gas.

Figure 1E:
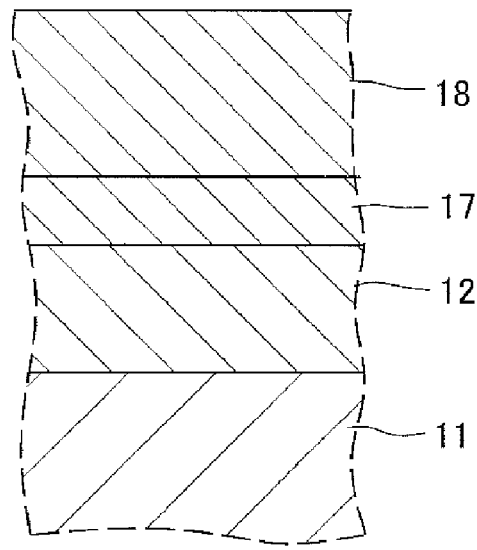

Next, in a second heat treatment as the step S6 in FIG. 2, as shown in FIG. 1E, the substrate implanted with ions is heat treated at a temperature not lower than 1050° C. and lower than the solidus temperature (for example, 1210° C.) under the oxidizing atmosphere.

Figure 4:
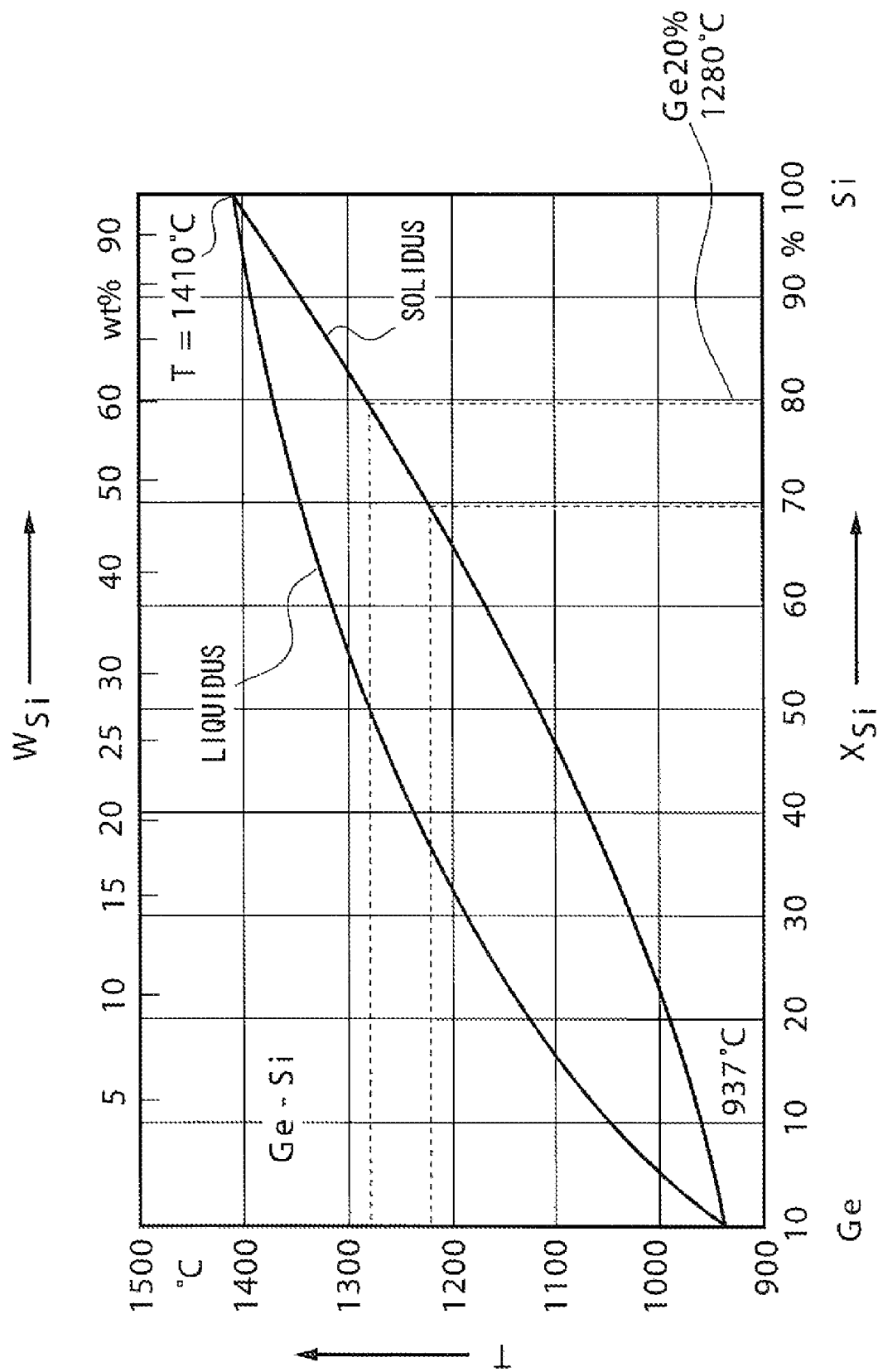
FIG. 4 is a graph showing a solidus of a SiGe system.

The oxidizing atmosphere for the heat treatment according to the present invention may be a 100% oxygen gas atmosphere, or an atmosphere containing oxygen. The heat treatment temperature is required to be lower than a solidus temperature of the SiGe system. As shown in the phase diagram of SiGe system in FIG. 4, the solidus temperature depends on the concentration of Ge, The lower horizontal axis in FIG. 4 indicates Si content $X_{Si}$ in % in the SiGe, and the vertical axis indicates temperature (° C.). In this graph among the two curves, the upper curve is called the liquidus. Above the liquidus temperature, SiGe is completely molten and is in liquid phase. The lower curve is called the solidus. Below the solidus temperature, the system is in a solid state. Under conditions shown as a region between the liquidus and the solidus, the system is at a state of partial melting. Therefore, in the present, embodiment, the heat treatment temperature is controlled to avoid melting of the layer.

A time period for the heat treatment is controlled such that all of the Si layer 13 and the SiGe layer 14 are converted to the SiGe layer by Ge diffusion from the SiGe layer 14 to the single crystalline Si layer 13 of the SOI substrate 10. As an example of a preferable heat treatment condition, if the SiGe mixed crystal is 100 nm in thickness and 30% in Ge concentration and the Si layer on the insulating layer is 100 nm in thickness, the heat treatment temperature is set at 1210° C., and the time period for the heat treatment is set to 2 hours.

By this heat treatment, Ge is caused to diffuse from the SiGe mixed layer 14 into the Si layer 13, thus forming the SiGe mixed layer. At the same time, under an oxidizing atmosphere, Si of the SiGe layer is oxidized, and therefore the $SiO_2$ film 16 is thickened to form a Si oxide film 18. The Ge concentration in the SiGe layer is increased as the thickness of the SiGe layer is decreased. As a result, an SiGe layer 17 having a Ge concentration higher than that of the SiGe layer 14 is formed. That is, by the oxidization of the SiGe layer, Ge is concentrated, thereby giving a high Ge concentration.

Next, in a third heat treatment as the step S7 in FIG. 2, the substrate is heat treated at a temperature not lower than 1050° C. and lower than the solidus temperature (for example, 1200° C.) under an inert atmosphere. By performing the third heat treatment, the implanted hydrogen ions weaken the bonding strength of the SiGe mixed layer 17 having an increased Ge concentration during heat treatment and the insulating layer 12, and enhance the strain relaxation, of the SiGe mixed layer 19. For example, the heat treatment temperature is set at 1200° C., and the time period for the heat treatment is set to 1 hour. This heat treatment is also performed under the condition of the heat treatment temperature controlled to be lower than the solidus temperature in order to avoid melting.

A relation between the ion amount in the ion implantation step and the degree of peak shift of a Raman spectrum obtained after the subsequent heat treatment and removal of the oxide film is explained hereinafter. In the case where hydrogen ions are not implanted, the substrate does not show sufficient peak shift of the Raman spectrum when the substrate is analyzed by an apparatus for Raman spectroscopy. That is, the SiGe layer 17 of the substrate does not show sufficient relaxation. On the other hand, a substrate which is implanted with hydrogen ions in an amount of not less than $1 \times 10^{14}$ atoms/cm$^2$, and subsequently heat treated for not shorter than 110 minutes, shows a sufficient peak shift of the Raman spectrum corresponding to the Ge content. That is, in this case, the SiGe layer is sufficiently relaxed.

Figure 1F:
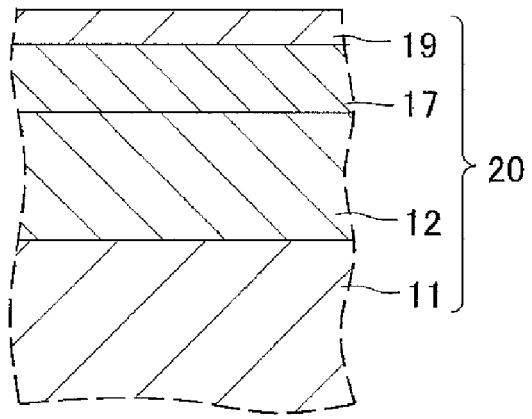

Next, as a step S8 in FIG. 2, the Si oxide film 18 is removed. Subsequently, as a step S9 in FIG. 2, as shown in FIG. 1F, a strained Si layer 19 is formed. Thus a strained Si—SOI substrate 20 comprising the insulating layer 12, the SiGe layer 17, and the strained Si layer 19 can be formed on the Si substrate 11.

Figure 6A:
FIG. 6A is a photograph showing the surface of a substrate according to a conventional technique.
Figure 6B:
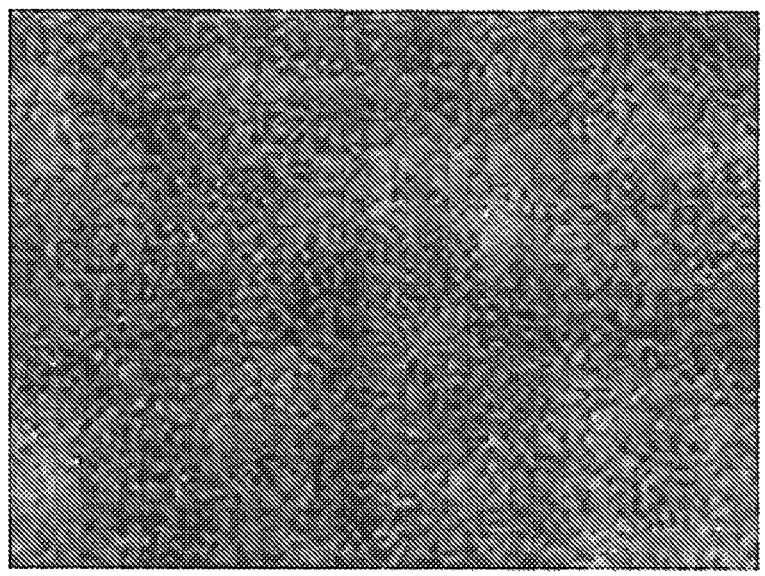
FIG. 6B is a photograph showing the surface of the strained Si—SOI substrate according to the present invention.

Since the above-described strained Si—SOI substrate 20 is heat treated in the first heat treatment including two-stage heat treatments at low and high temperatures, and the third heat treatment under an inert gas atmosphere respectively, the surface roughness of the substrate can be controlled to be approximately not more than 0.45 nm in RMS. That is, the substrate shows excellent flatness. In addition, the penetrating dislocation density can also be reduced to as low as $5 \times 10^4$/cm$^2$. As an example of the substrate produced by the present embodiment, FIG. 6B shows a substrate having a surface RMS: 0.42 nm. Cross-hatches in this substrate are greatly reduced compared to the substrate having a surface RMS; 0.60 nm shown in FIG. 6A as an example of a substrate produced by a conventional method. Further, the quality of SOI wafers having a relaxed SiGe layer and a strained Si layer on an oxide film layer is improved by modifying the surface condition of the substrate surface. Thus, a strained Si—SOI substrate having reduced surface roughness and reduced defects can be obtained.

Figure 5:
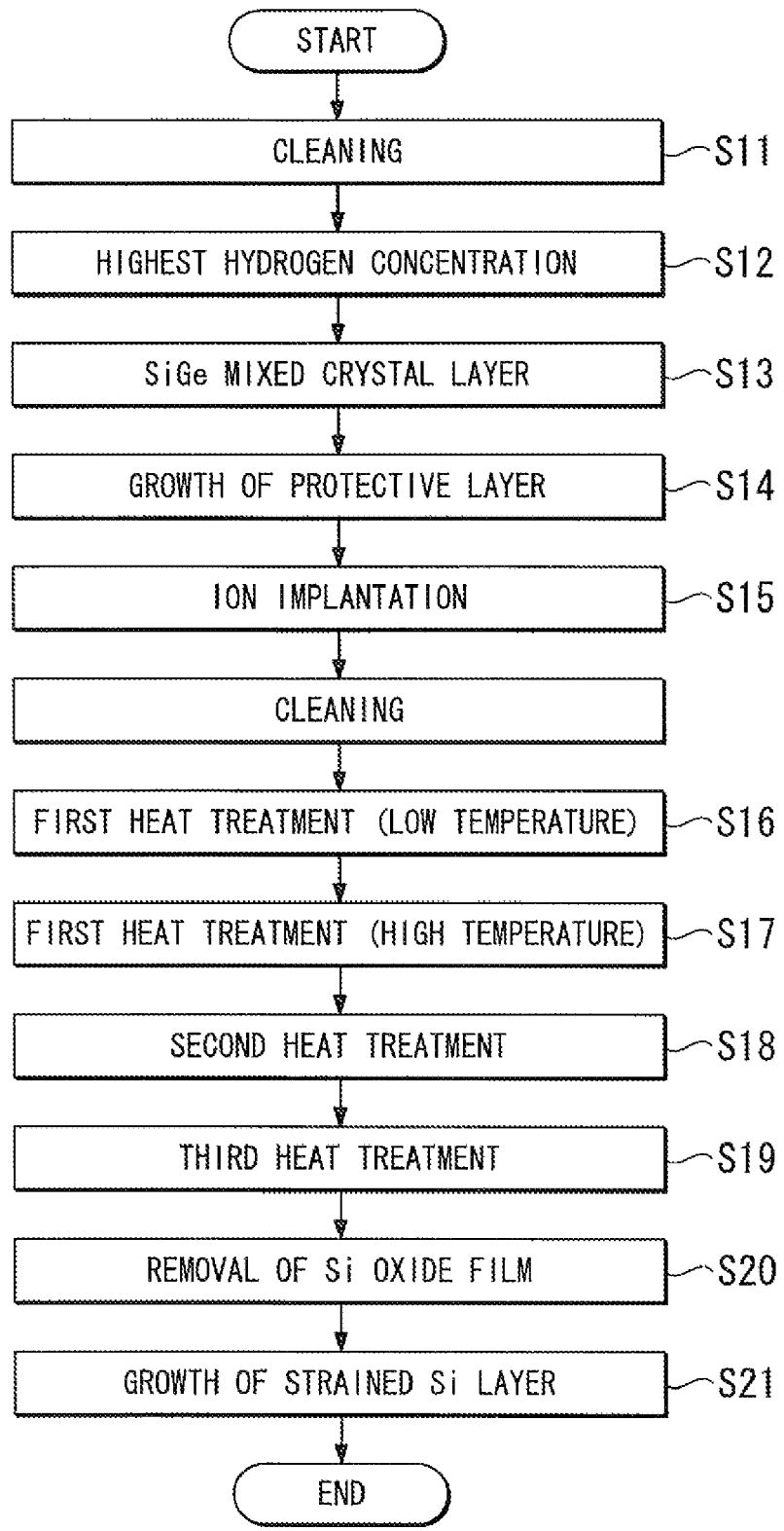
FIG. 5 is a process chart indicating another embodiment of a method for producing a strained Si—SOI substrate of according to the present invention.

Next, a second embodiment of a method for producing a strained Si—SOI substrate is described with reference to the drawings. FIG. 5 is a process chart showing the method for producing a strained Si—SOI substrate in accordance with the second embodiment. A description for the structural elements corresponding to the structural elements of the first embodiment is omitted because the same symbols are used.

An SOI wafer 10 is prepared, which comprises a Si layer 13 of not less than 5 nm in thickness in a buried oxide film 12.

The SOI substrate 10 may be produced by a known method such as a SIMOX method, or a bonding method (e.g., a Smart-Cutting method and an ELTRAN method).

Next, as a step S11 in FIG. 5, the SOI substrate 10 for forming a SiGe layer 14 is subject, to cleaning. The method for cleaning the SOI substrate may be selected from conventional cleaning methods such as SC-1+SC-2 cleaning, cleaning with a mixing solution of HF/O$_3$, and reciprocal cleaning alternately using an HP solution and an O$_3$ solution.

After cleaning of the substrate, as a step S12 in FIG. 5, a hydrogen baking treatment S12 is performed before epitaxial growth of a SiGe layer in order to ensure that the wafer 10 has a clean surface free of oxygen and carbon impurities by removing a spontaneous surface oxide film, or the like.

The hydrogen baking treatment is performed at a temperature in the range of 900 to 1200° C. The atmosphere for the hydrogen baking treatment may be controlled to have normal pressure or a reduced pressure. The pressure may be selected according to an apparatus for epitaxial growth.

Next, as a step S13 in FIG. 5, a SiGe layer 14 is epitaxially grown on the surface of the SOI wafer 10. A lamp-heating CVD apparatus, a UHV-CVD apparatus, or an MBE apparatus or the like may be used as an apparatus for epitaxial growth. For example, for epitaxial growth of the SiGe layer 14 using a lamp-heating CVD apparatus, it is preferable to control the temperature to be not more than 1000° C., and more preferably, in a range of 500 to 800° C. The ambient pressure is generally controlled to be a reduced pressure not more than 13330 Pa (100 torr). It is important to control the thickness of the SiGe layer to be thinner than the critical thickness. The critical thickness depends on the epitaxial growth temperature and the Ge concentration of the SiGe layer.

In addition, before the epitaxial growth of the SiGe layer 14, a Si seed layer may be formed on the surface of the SOI wafer 10. By preparing the Si seed layer, it is possible to improve surface conditions of the SOI wafer 10, thereby improving the film formation state of the SiGe layer 14. Specifically, it is possible to form the Si seed layer in advance for forming the SiGe layer 14 by not feeding a germane gas, but only feeding a gaseous raw material gas for silicon such as si lane into the apparatus for epitaxial growth. Here, the thickness of the Si seed layer may be selected to be an appropriate value. For example, for obtaining a thin film of the SiGe layer of not more than 100 nm in thickness, it is preferable to form a thin Si seed layer of about 5 nm in thickness, in view of reducing the process time.

After the epitaxial growth of the SiGe layer, as a step S14 in FIG. 5, a Si layer 15 is epitaxially grown on the SiGe layer 14.

As a further protective film, a SiO$_2$ film 16 is formed on the Si layer 15 using a CVD method. The SiO$_2$ film 16 may be formed as a thin layer provided that the thickness is sufficient for inhibiting deterioration of the surface roughness of the Si layer 15. For example, the SiO$_2$ film 16 may be around 20 nm in thickness. The $SiO_2$ film 16 having a thickness of 10 to 20 nm may be formed as a protective film by oxidizing the above-described Si layer 15.

As a step S15 in FIG. 5, hydrogen ions are implanted into the vicinity of an interface A of the single crystalline Si layer 13 and the buried oxide film 12. The ion amount is controlled to be $5 \times 10^{14}$ to $1 \times 10^{17}$ atoms/cm$^2$, preferably $3 \times 10^{15}$ to $2 \times 10^{16}$ atoms/cm$^2$.

The depth for ion implantation is preferably selected depending on the thickness of the Si layer/SiGe layer/Si protective layer on the buried oxide film.

After the ion implantation, as steps S16 and S17 in FIG. 5, the substrate is annealed at a temperature in the range of 400 to 1000° C. It is preferable to perform the annealing under an inert gas atmosphere. It is preferable that the annealing include a first heat treatment (step S16) at 400 to 650° C. and a second heat treatment (step S17) at 650 to 1000° C.

During the first heat treatment (step S16), implanted ions concentrate in the vicinity of the interface between the single crystalline Si layer 13 and the buried oxide film 12. During the second heat treatment (step S17), the bonding strength of the single crystalline Si layer 13 and the buried oxide film 12 is weakened. By this treatment, during the subsequent heat treatment at a temperature not lower than 1050° C., the interface slip between the SiGe layer 17 and the oxide film 12 is enhanced, and the SiGe layer 17 is easily relaxed.

Next, as a step S18 in FIG. 5, heat treatment is performed at a temperature not lower than 1050° C. under an oxidizing atmosphere. The purpose of this step is to ensure that the SiGe layer 17 has a desired thickness and Ge concentration by diffusing Ge from the SiGe layer 14 to the Si layer 13, and by forming a Si oxide film 18. Another purpose of this step is to generate interface slips at the interface between the SiGe layer 17 and the buried oxide film 12. At the temperature region not lower than 1050° C., the diffusion rate of Ge in the Si layer 13 is higher than the oxidization rate of the surface of the SiGe layer 17 under an oxidizing atmosphere. Therefore, without the occurrence of a heterogeneous distribution of Ge, such as an occurrence of localized portions of a high Ge content, Ge is homogeneously distributed throughout the SiGe layer 17, and the interface between the SiGe layer 17 and the buried oxide film generates interface slips. As a result, the SiGe layer 17 having enhanced relaxation shows a homogeneous distribution of the Ge concentration in the depth direction.

Thus, in this case, it is preferable to use a temperature as high as possible, that is not lower than 1100° C. Further, the oxygen partial pressure in the oxidizing atmosphere may be controlled so as to ensure that the diffusion rate of the Ge in the Si is higher than the oxidization rate of the Si.

It is important that the temperature be controlled to be lower than the solidus temperature corresponding to the final Ge content of the SiGe layer 17 to prevent the melting of the SiGe layer 17.

In addition, as a step S19 in FIG. 5, heat treatment is performed at a temperature not lower than 1050° C. By this heat treatment, relaxation of the SiGe layer that had formed in the previous heat treatment in an oxidizing condition can be promoted. This heat treatment is preferably performed under inert atmosphere (including a nitrogen gas, an Ar gas or the like).

The temperature is set high enough to avoid melting of the SiGe layer. The heat treatment time is preferably set to 5 minutes or longer, as the time for maintaining the highest temperature. The time for maintenance is suitably selected to promote relaxation of the SiGe layer.

Further, as a step S20 in FIG. 5, from the SOI substrate including the relaxed SiGe layer 17 and the Si oxide film 18 on the buried oxide film 12, the oxide film is removed using a diluted HF aqueous solution. Alternatively, another conventional method, for example, a method using a buffered HF solution or an ammonium fluoride solution may be employed.

Next, as a step 21 in FIG. 5, the SOI wafer is introduced into the apparatus for epitaxial growth and a spontaneous oxide film on the surface is removed by hydrogen baking, or the like. After that, a strained Si layer 19 is epitaxially grown on the SiGe layer 17. The strained Si layer 19 is formed to be thinner man a critical thickness which depends on the Ge content of the SiGe layer 17 and the growth temperature.

Hydrogen baking may be performed, for example, at a temperature in the range of 750° C. to 900° C. The time for hydrogen baking is preferably from 30 seconds to 5 minutes. At a temperature higher than 900° C., a Si layer is formed on the SiGe layer 17 by evaporation of Ge. In such a case, when the strained Si layer is epitaxially grown on the substrate, there is a possibility that the thickness of the strained Si layer exceeds the critical thickness and the interface between the strained Si layer 19 and the SiGe layer 17 may have defects, thus it is not preferable. Therefore, a temperature higher than 900° C. is not preferable. On the other hand, at 750° C., hydrogen baking for longer than 5 minutes shows no obvious effect, as compared to hydrogen baking for 5 minutes or less. The atmospheric pressure is preferably controlled to be reduced pressure. For the epitaxial growth of Si, a Si gas, such as disilane, monosilane, and dichlorosilane is used.

As explained above, a strained Si—SOI substrate 20 is formed.

While preferred embodiments of the present invention have been described as above, it should be understood that the present invention is not limited thereto. Additions, omissions, substitutions, and other modifications can be made without departing from the spirit of the present invention. Accordingly, the present invention should not to be considered as limited by the foregoing description, and is only limited by the scope of the appended claims.

EXAMPLES

1) Example-1

A P-type SOI substrate 10 of 200 mm in diameter was prepared by the SIMOX method. The thickness of a single crystalline Si layer 13 on a buried oxide film 12 was 50 nm, and the thickness of the buried oxide film 12 was 140 nm.

Subsequently, after cleaning of each SOI wafer (SOI substrate) 10 by an SC-1+SC-2 cleaning method, the wafer was immediately loaded to a lamp-heating, single wafer epitaxial growth apparatus.

Before the epitaxial growth of the SiGe layer 14, the SOI wafer 10 was subject to a hydrogen baking treatment. For the baking, the temperature was at 1125° C., the pressure was 2666 Pa (20 torr), the hydrogen flow rate was 20 SLM (liter per minute at a standard state), and the treatment time was 45 seconds.

After cleaning of the surface of the substrate 10 by the hydrogen baking treatment, a SiGe layer 14 was epitaxially grown. The thickness of the SiGe layer was 100 nm, and its Ge concentration was 10%.

For this epitaxial growth, the temperature was set at 730° C., the pressure was 2666 Pa (20 torr), the hydrogen flow rate was 20 SLM, and a silane gas and a germane gas were fed. Next, a protective film, of the Si layer 15 of 5 nm in thickness was epitaxially grown by stopping the feed of the germane gas, setting the temperature at 700° C. and maintaining the other conditions the same as above.

Next, the wafer was extracted, and a Si oxide ($SiO_2$) film 16 of 20 nm in thickness was formed using a plasma CVD apparatus.

Next, after forming the oxide film on each SOI wafer 10, using an apparatus for ion implantation, using conditions such that a portion of the highest ion concentration was located at the interface between the Si layer 13 and the buried oxide film 12, the hydrogen ions were implanted into each wafer in the amounts of $3\times10^{14}$, $5\times10^{14}$, $1\times10^{15}$, $5\times10^{15}$, $1\times10^{16}$, $3\times10^{16}$, $5\times10^{16}$, and $1\times10^{17}$ atoms/cm$^2$, respectively.

In addition, an SOI wafer which had not been implanted with ions was prepared, in which the SiGe layer 14 and the protective film were also formed in this wafer.

Next, the SOI wafers were extracted from the apparatus for ion implantation, and both sides of each wafer were cleaned. Then, the wafers were subjected to a heat treatment.

Heat treatment was performed at 500° C. for 30 minutes, and after that, at 850° C. for 2 hours. A nitrogen gas atmosphere was used as the atmosphere for the heat treatment.

Next, the temperature was lowered to 700° C., and the atmosphere was changed to an oxidizing atmosphere. Them the temperature was increased to 1200° C., and maintained for 2 hours. Thereafter, the temperature was lowered to 700° C., and the atmosphere was changed to a nitrogen atmosphere. Then, the temperature was increased to 1200° C., and maintained for 1 hour. Thereafter, the temperature was lowered to 700° C. and the SOI wafers 10 were extracted.

Next, an oxide film formed on the surface of the SOI wafer 10 was removed using a dilute HF aqueous solution at an HF concentration of 10%. The solution was maintained at room, temperature, and the wafers were immersed in the solution for 20 minutes. After that, the wafers were immersed in pure water for 15 minutes. Immediately after spin drying the wafer, the wafer was introduced to a lamp-heating, single wafer epitaxial growth apparatus, and a Si layer of 5 nm in thickness was epitaxially grown on the surface of the SiGe layer 17. As conditions for the growth, the temperature was set at 700° C., the pressure was controlled to be 2666 Pa (20 torr), and a monosilane gas was fed with a hydrogen flow of 20 SLM to grow the Si layer.

For each of the above-described hydrogen implantation doses, one wafer was subject to analysis of the degree of relaxation using an apparatus for Raman spectroscopy. In addition, the surface roughness of each wafer was measured using an AFM (Atomic Force Microscope).

A laser beam of 443 nm in wavelength was used for the Raman spectroscopy. An area for measurement of 20 μm×20 μm was subject to AFM analysis.

Next, each wafer was divided into four pieces. One piece of each wafer was etched by way of Secco etching, and was analyzed for a penetrating dislocation density.

Etching was carried out to a depth of 30 nm from the surface. The numbers of etch pits were counted using a differential interference microscope.

Using another piece among the other pieces, the film thickness and the Ge concentration of the SiGe layer were analyzed using SIMS (Secondary Ion Mass Spectroscopy).

The results are summarized in Table 1.

TABLE 1

| Items | \multicolumn{8}{c|}{Level No.} | Note |
|---|---|---|---|---|---|---|---|---|---|
|  | 1 | 2 | 3 | 4 | 5 | 6 | 7 | 8 |  |
| Hydrogen Ion Implanted | None | 3.00E+14 | 5.00E+14 | 1.00E+15 | 5.00E+15 | 1.00E+16 | 3.00E+16 | 5.00E+16 | Unit: atoms/cm$^2$ |
| Degree of Relaxation | 60 | 80 | 85 | 90 | 90 | 90 | 90 | 90 | Unit: % |
| Penetrating Dislocation Density | 1.00E+07 | 7.00E+05 | 1.00E+05 | 5.00E+04 | 4.00E+04 | 4.00E+04 | 5.00E+04 | 5.00E+04 | Unit: /cm$^2$ |
| Ge Concentration | 20.1 | 20 | 20.1 | 20.1 | 20.1 | 20.05 | 20 | 20 | Unit: % |
| Thickness of SiGe Layer | 50 | 50.1 | 50.1 | 50.2 | 50 | 49.9 | 50 | 50.1 | Unit: nm |
| Surface Roughness | 0.6 | 0.5 | 0.45 | 0.38 | 0.35 | 0.39 | 0.39 | 0.41 | Unit: nm |

From the results as shown in table 1, it was confirmed that when the hydrogen implantation amount exceeded $5\times10$ atoms/cm$^2$, bubbles of several μm in size would appear in the wafer with a density of about $1\times10^4$/cm$^2$, and lower the surface quality. Furthermore, when the hydrogen implantation amount was less than $3\times10^{14}$ atoms/cm$^2$, the effect of strain relaxation by ion implantation cannot be obtained.

2) Comparative Example 1

In this Comparative Example 1, the same treatment was performed as described in Example 1, except that the final heat treatment (the third heat treatment) performed at 1200° C. for 1 hour after heat treatment under an oxidizing atmosphere was omitted.

For each of the above-described hydrogen implantation doses, one wafer was subject to analysis of the degree of relaxation of the SiGe layer using the apparatus for Raman spectroscopy. In addition, the surface roughness of each wafer was measured using AFM. A laser beam of 443 nm in wavelength was used for the Raman spectroscopy. An area for measurement of 20 μm×20 μm was subject to the AFM analysis.

Next, each wafer was divided into four pieces. One piece of each wafer was etched by way of Secco etching, and was analyzed for a penetrating dislocation density.

Etching was carried out to a depth of 30 nm from the surface. The number of etch pits were counted using the differential interference microscope. Using another piece among the other pieces, the film thickness and the Ge concentration of the SiGe layer were analyzed using SIMS. The results are summarized in Table 2.

TABLE 2

| Items | Level No. 1 | 2 | 3 | 4 | 5 | 6 | 7 | 8 | Note |
|---|---|---|---|---|---|---|---|---|---|
| Hydrogen Ion Implanted | None | 3.00E+14 | 5.00E+14 | 1.00E+15 | 5.00E+15 | 1.00E+16 | 3.00E+16 | 5.00E+16 | Unit: atoms/cm$^2$ |
| Degree of Relaxation | 60 | 70 | 75 | 75 | 75 | 75 | 75 | 75 | Unit: % |
| Penetrating Dislocation Density | 1.00E+07 | 1.00E+06 | 5.00E+05 | 3.00E+05 | 1.00E+05 | 1.00E+05 | 1.00E+05 | 1.00E+05 | Unit: /cm$^2$ |
| Ge Concentration | 20.1 | 20 | 20.1 | 20.1 | 20.1 | 20.05 | 20 | 20 | Unit: % |
| Thickness of SiGe Layer | 50 | 50.1 | 50.1 | 50.2 | 50 | 49.9 | 50 | 50.1 | Unit: nm |
| Surface Roughness | 0.6 | 0.5 | 0.51 | 0.48 | 0.49 | 0.5 | 0.49 | 0.49 | Unit: nm |

3) Example 2

A P-type SOI substrate 10 of 200 mm in diameter was prepared by an SIMOX method. In each wafer, the thickness of a single crystalline Si layer 13 on a buried oxide film 12 was 50 nm, and the thickness of the buried oxide film 12 was 140 nm.

Subsequently, after cleaning of each SOI wafer 10 by an SC-1+SC-2 cleaning method, the wafer was immediately loaded to the lamp-heating, single wafer epitaxial growth apparatus.

Before the epitaxial growth of the SiGe layer 14, the SOI wafer 10 was subjected to a hydrogen baking treatment. For the baking, the temperature was set at 1125° C., the pressure was 2666 Pa (20 torr), the hydrogen flow rate was 20 SLM, and the treatment time was 45 seconds. After cleaning the surface by way of the hydrogen baking treatment, a SiGe layer 14 was epitaxially grown. The film thickness was 140 nm, and its Ge concentration was 10%.

For this epitaxial growth, the temperature was set at 730° C., the pressure was 2666 Pa (20 torr), the hydrogen flow rate was 20 SLM, and a silane gas and a germane gas were fed as raw materials. Next, a Si layer 15 of 5 nm in thickness was epitaxially grown by stopping the feed of the germane gas, setting the temperature at 700° C., and maintaining the other conditions the same as those for growing the SiGe layer.

Next, each wafer was extracted, and a Si oxide (SiO$_2$) film 16 of 20 nm in thickness was formed using a plasma CVD apparatus.

Next, after forming the Si oxide film on the SOI wafers 10, using an apparatus for ion implantation, using conditions such that a portion of highest ion concentration was located at the interface between the Si layer 13 and the buried oxide film 12, the hydrogen ions were implanted into each wafer in the amount of 3×10$^{14}$, 5×10$^{14}$, 1×10$^{15}$, 5×10$^{53}$, 1×10$^{16}$, 3×10$^{16}$, 5×10$^{16}$ and 1×10$^{17}$ atoms/cm$^2$.

In addition, an SOI wafer which had not been implanted with hydrogen ions was prepared. The above-described film was formed in this wafer.

Next, the wafers were extracted from the apparatus for ion implantation, and both sides of each wafer were cleaned. Then, the wafers were subjected to a heat treatment.

Heat treatment was performed at 500° C. for 30 minutes, and after that, at 850° C. for 2 hours. A nitrogen gas atmosphere was used as the atmosphere for the heat treatment.

Next, the temperature was lowered to 700° C. and the atmosphere was changed to an oxidizing atmosphere. Then, the temperature was increased to 1200° C., and maintained for 2 hours, Thereafter, tire temperature was lowered to 700° C., and the atmosphere was changed to a nitrogen atmosphere. Then, the temperature was increased to 1200° C., and maintained for 3.5 hours. Thereafter, the temperature was lowered to 700° C., and the SOI wafers 10 were extracted.

Next, an oxide film formed on the surface was removed using dilute HF aqueous solution at an HF concentration of 10%. The solution was maintained at room temperature and the wafers were immersed in the solution for 20 minutes. After that, the wafers were immersed in pure water for 15 minutes. After spin drying the wafer, the wafer was immediately introduced to a lamp-heating, single wafer epitaxial growth apparatus, and a Si layer 19 of 5 nm in thickness was epitaxially grown on the SiGe layer 17. As conditions for growing the Si layer, the temperature was set at 700° C., the pressure was controlled to 2666 Pa (20 torr), and a monosilane gas was fed with a hydrogen flow of 20 SLM.

For each of the above-described hydrogen implantation doses, one wafer was subject to analysis of the degree of relaxation using an apparatus for Raman spectroscopy. In addition, the surface roughness of each wafer was measured using AFM.

A laser beam of 443 nm in wavelength was used for the Raman spectroscopy. An area for measurement of 20 μm×20 μm was subject to AFM analysis.

Next, each wafer was divided into four pieces. One piece of each wafer was etched by way of Secco etching, and was analyzed for a penetrating dislocation density.

Etching was carried out to a depth of 30 nm from the surface. The numbers of etch pits were counted using a differential interference microscope.

Using another piece among the other pieces, the film thickness and the Ge concentration of the SiGe layer were analyzed using SIMS.

The results are summarized in Table 3.

TABLE 3

| Items | 1 | 2 | 3 | 4 | 5 | 6 | 7 | 8 | Note |
|---|---|---|---|---|---|---|---|---|---|
| Hydrogen Ion Implanted | None | 3.00E+14 | 5.00E+14 | 1.00E+15 | 5.00E+15 | 1.00E+16 | 3.00E+16 | 5.00E+16 | Unit: atoms/cm$^2$ |
| Degree of Relaxation | 35 | 60 | 70 | 70 | 70 | 70 | 70 | 70 | Unit: % |
| Penetrating Dislocation Density | 1.00E+07 | 7.00E+05 | 1.00E+05 | 5.00E+04 | 4.00E+04 | 4.00E+04 | 5.00E+04 | 5.00E+04 | Unit: /cm$^2$ |
| Ge Concentration | 30 | 30.1 | 30 | 30.1 | 30 | 30 | 30 | 30.1 | Unit: % |
| Thickness of SiGe Layer | 47.1 | 46.8 | 47.1 | 47 | 46.9 | 47 | 47.1 | 46.9 | Unit: nm |
| Surface Roughness | 0.6 | 0.5 | 0.45 | 0.38 | 0.35 | 0.39 | 0.39 | 0.41 | Unit: nm |

From the results as shown, in table 3, it was confirmed that when the hydrogen implantation amount exceeded $5\times10^{16}$ atoms/cm$^2$, bubbles of several am in size would appear in the wafer with a density of about $1\times10^4$/cm$^2$, and lower the surface quality. And, when the hydrogen implantation amount was less than $3\times10^{14}$ atoms/cm$^2$, the effect of strain relaxation by ion implantation cannot be obtained.

4) Comparative Example-2

In this Comparative Example 2, the same treatment was performed as described in Example 2, except that the final heat treatment (the third heat treatment) performed at 1200° C. for 1 hour after heat treatment under an oxidizing atmosphere was omitted.

For each of the above-described hydrogen implantation doses, one wafer was subject to analysis of the degree of relaxation of the SiGe layer using the apparatus for Raman spectroscopy. In addition, the surface roughness of each wafer was measured using AFM. A laser beam of 443 nm in wavelength was used for the Raman spectroscopy. An area for measurement of 20 μm×20 μm was subject, to the AFM analysis.

Next, each wafer was divided into four pieces. One piece of each wafer was etched by way of Secco etching, and was analyzed for a penetrating dislocation density.

Etching was carried out to a depth of 30 nm from the surface. The number of etch pits were counted using the differential interference microscope.

Using another piece among the other pieces, the film thickness and the Ge concentration of the SiGe layer were analyzed using SIMS.

The results are summarized in Table 4.

As described above, by comparing the Examples with the Comparative Examples, it was confirmed that employing the third heat treatment performed at not less than 1050° C. improved the surface roughness and decreased defects. At the same time, the degree of relaxation of the SiGe layer 18 was increased.

It was found that the third heat treatment enhanced the improvement of the degree of relaxation in accordance with thinning the film thickness of the relaxed SiGe layer.

The third heat treatment had the same effects even though it was performed for more than 3 hours. Therefore, the maximum treatment time should not be more than 3 hours. Furthermore, it is necessary for the improvement of the degree of relaxation to accompany the heat treatment with the ion implantation method.

In above described Examples and Comparative Examples, the first heat treatment, the second heat treatment and the third heat treatment were continuously performed in one heat treatment furnace under a changing atmosphere. However, two or more of the first heat treatment, the second heat treatment or the third heat treatment could have been performed in the heat treatment furnaces since the same effects were obtained.

In the present Examples and Comparative Examples, the case of implanting hydrogen ions is described. However, in the case of implanting fluorine, neon or helium ions, similar effects can be obtained. The amount of ions to be implanted may be determined in inverse proportion to the atomic weight of the element per atomic weight of hydrogen. For example, the amount of helium to be implanted may be one fourth of the amount of hydrogen to be implanted.

There is possibility of Ge remaining on the backside or chamfer of the wafer. The remaining Ge may be removed by the polishing process or acid etching treatment on the backside or chamfer of the wafer before the heat treatment.

TABLE 4

| Items | 1 | 2 | 3 | 4 | 5 | 6 | 7 | 8 | Note |
|---|---|---|---|---|---|---|---|---|---|
| Hydrogen Ion Implanted | None | 3.00E+14 | 5.00E+14 | 1.00E+15 | 5.00E+15 | 1.00E+16 | 3.00E+16 | 5.00E+16 | Unit: atoms/cm$^2$ |
| Degree of Relaxation | 32 | 35 | 40 | 50 | 55 | 57 | 60 | 60 | Unit: % |
| Penetrating Dislocation Density | 1.00E+07 | 1.00E+06 | 5.00E+05 | 3.00E+05 | 1.00E+05 | 1.00E+05 | 1.00E+05 | 1.00E+05 | Unit: /cm$^2$ |
| Ge Concentration | 30 | 30.1 | 30 | 30.1 | 30 | 30 | 30 | 30.1 | Unit: % |
| Thickness of SiGe Layer | 47.1 | 46.9 | 47.01 | 46.9 | 47 | 47.05 | 47 | 46.95 | Unit: nm |
| Surface Roughness | 0.6 | 0.5 | 0.51 | 0.48 | 0.49 | 0.5 | 0.49 | 0.49 | Unit: nm |

Moreover, in the present Examples, the Si layer or the SiO₂ film was used as the protective film. However, it is clear that a multi-layered film of a Si layer and a vapor growth SiO₂ film can be used as the protective film without departing from the significance of the present invention.

What is claimed is:

1. A method for producing a strained Si—SOI substrate, comprising the steps of:
   growing a SiGe mixed crystal layer on an SOI substrate having an Si layer of not less than 5 nm in thickness and a buried oxide film;
   forming a protective film on the surface of the SiGe mixed crystal layer;
   implanting light element ions into the vicinity of the interface between the silicon layer and the buried oxide film;
   performing a first heat treatment for heat treating the substrate at a temperature in the range of 400 to 1000° C.;
   performing a second heat treatment for heat treating the substrate at a temperature not lower than 1050° C. under an oxidizing atmosphere;
   performing a third heat treatment for heat treating the substrate at a temperature not lower than 1050° C. under an inert atmosphere;
   removing a Si oxide film formed on the surface; and
   forming a strained Si layer;
   wherein the temperature of the third heat treatment is not less than the temperature of the second heat treatment.

2. The method for producing a strained Si—SOI substrate according to claim 1, wherein the SiGe mixed crystal layer is an epitaxial layer.

3. The method for producing a strained Si—SOI substrate according to claim 1, wherein the protective film is a Si layer.

4. The method for producing a strained Si—SOI substrate according to claim 1, wherein the protective film is a vapor growth SiO₂ film.

5. The method for producing a strained Si—SOI substrate according to claim 1, wherein the protective film is a multi-layered film comprising a Si Layer and a vapor growth SiO₂ film.

6. The method for producing a strained Si—SOI substrate according to claim 1, wherein the light element is at least one selected from the group consisting of hydrogen, helium, fluorine, and neon.

7. The method for producing a strained Si—SOI substrate according to claim 1, wherein the first heat treatment is performed under inert atmosphere.

8. The method for producing a strained Si—SOI substrate according to claim 1, wherein the first heat treatment includes a low temperature treatment performed at a temperature in the range of 400 to 650° C., and a high temperature treatment performed at a temperature in the range of 650 to 1000° C.

9. The method for producing a strained Si—SOI substrate according to claim 1, wherein the strained Si layer is formed by epitaxial growth.

* * * * *